US012568601B2

(12) United States Patent　　　　(10) Patent No.:　US 12,568,601 B2
　　Sanada　　　　　　　　　　　　　　(45) Date of Patent:　　Mar. 3, 2026

(54) COOLING APPARATUS FOR ELECTRONIC DEVICE

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 228 days.

(21) Appl. No.: 18/361,960

(22) Filed: Jul. 31, 2023

(65) Prior Publication Data

US 2024/0155805 A1　　May 9, 2024

(30) Foreign Application Priority Data

Nov. 8, 2022　　(JP) ................................. 2022-178623

(51) Int. Cl.
　　*H05K 7/20*　　　　　(2006.01)
　　*G06F 1/20*　　　　　(2006.01)
(52) U.S. Cl.
　　CPC ........... *H05K 7/20145* (2013.01); *G06F 1/20* (2013.01); *H05K 7/20154* (2013.01); *H05K 7/2039* (2013.01)
(58) Field of Classification Search
　　CPC ............. H01L 23/467; H01L 2023/405; H01L 23/4006; G06F 1/20; G06F 1/203; G06F 2200/201; G06F 1/206; H05K 7/20154; H05K 7/2039; H05K 7/20145
　　See application file for complete search history.

(56) References Cited

U.S. PATENT DOCUMENTS

| | | | | |
|---|---|---|---|---|
| 4,770,242 A | * | 9/1988 | Daikoku | ............. H01L 23/4338 |
| | | | | 257/713 |
| 5,014,117 A | * | 5/1991 | Horvath | .............. H01L 23/4338 |
| | | | | 257/722 |
| 6,401,807 B1 | * | 6/2002 | Wyler | ................... H01L 23/467 |
| | | | | 174/16.3 |
| 8,689,857 B2 | * | 4/2014 | Lee | .......................... F28F 3/02 |
| | | | | 165/185 |

(Continued)

FOREIGN PATENT DOCUMENTS

| | | |
|---|---|---|
| JP | 2003-023283 | 1/2003 |
| JP | 2003-283171 | 10/2003 |

(Continued)

OTHER PUBLICATIONS

Japanese Office Action for Japanese Patent Application No. 2022-178623 mailed Nov. 11, 2025.

*Primary Examiner* — Adam B Dravininkas

(74) *Attorney, Agent, or Firm* — Amin, Turocy & Watson, LLP

(57) ABSTRACT

The cooling apparatus for the electronic device includes a heat sink, the fan, and a drift rib. In the heat sink, a plurality of fins is erected side by side in a thickness direction on a base portion that receives heat of an electronic component. The fan generates an air flow between the fins by air blowing caused by rotation. The drift rib is positioned on a tip end side of the fin on a downstream side in an air blowing direction of a central portion of the fan in a width direction, has an inclined surface guiding air flowing through the position toward a root side of the fin, and is to be inserted between the adjacent fins.

18 Claims, 5 Drawing Sheets

(56) References Cited

U.S. PATENT DOCUMENTS

| | | | | |
|---|---|---|---|---|
| 9,841,772 | B2 * | 12/2017 | Bucher | H04B 10/503 |
| 10,074,591 | B1 * | 9/2018 | Kulkarni | H01L 23/427 |
| 12,218,027 | B2 * | 2/2025 | Teranishi | H05K 7/20136 |
| 2007/0097633 | A1 * | 5/2007 | Chen | H01L 23/467 |
| | | | | 257/E23.099 |
| 2009/0154103 | A1 * | 6/2009 | Liu | H01L 23/467 |
| | | | | 361/709 |
| 2009/0195988 | A1 * | 8/2009 | Hongo | G06F 1/203 |
| | | | | 361/709 |
| 2010/0170657 | A1 * | 7/2010 | Kaslusky | H05K 7/20163 |
| | | | | 165/80.3 |
| 2011/0286178 | A1 * | 11/2011 | Bridges | G06F 1/20 |
| | | | | 165/185 |
| 2021/0080199 | A1 * | 3/2021 | Kim | F28F 13/06 |

FOREIGN PATENT DOCUMENTS

| | | |
|---|---|---|
| JP | 2007-025097 | 2/2007 |
| JP | 2021-185592 | 12/2021 |

* cited by examiner

*FIG. 1*

COOLING APPARATUS FOR ELECTRONIC DEVICE

CROSS-REFERENCE TO RELATED APPLICATION

This application is based upon and claims the benefit of priority from Japanese Patent Application No. 2022-178623, filed on Nov. 8, 2022, the entire contents of which are incorporated herein by reference.

FIELD

Embodiments described herein relate to a cooling apparatus for an electronic device.

BACKGROUND

In the related art, an electronic device such as a personal computer (PC) includes a component whose temperature may increase, such as a central processing unit (CPU). In general, a heat sink is attached to such a component for heat dissipation, a fan and a duct are disposed such that gas (air) around the heat sink appropriately flows, and positions of suction and exhaust holes of the duct are determined.

Here, depending on an amount, an arrangement, and the like of components built in a housing of an electronic device, a component (obstacle) that prevents gas from smoothly passing through may be disposed on a leeward side of the fan. In this case, a heat dissipation performance deteriorates, which is not preferable.

A general fan for such an application is an axial flow fan (propeller fan), and a wind speed tends to be slow in a region downstream of a rotation shaft due to a mechanism of the axial flow fan.

DESCRIPTION OF THE DRAWINGS

FIG. 1 is a perspective view illustrating an example of an appearance of a duct according to a first embodiment;

DETAILED DESCRIPTION

An aspect of embodiments is to provide a cooling apparatus for an electronic device which can obtain a high heat dissipation performance when there is an obstacle on a leeward side of a fan that blows air for heat dissipation.

A cooling apparatus for an electronic device according to an embodiment includes a heat sink, the fan, and a drift rib. In the heat sink, a plurality of fins is erected side by side in a thickness direction on a base portion that receives heat of an electronic component. The fan generates an air flow between the fins by air blowing caused by rotation. The drift rib is positioned on a tip end side of the fin on a downstream side in an air blowing direction of a central portion of the fan in a width direction, has an inclined surface guiding air flowing through the position toward a root side of the fin, and is to be inserted between the adjacent fins.

First Embodiment

Figure 1:
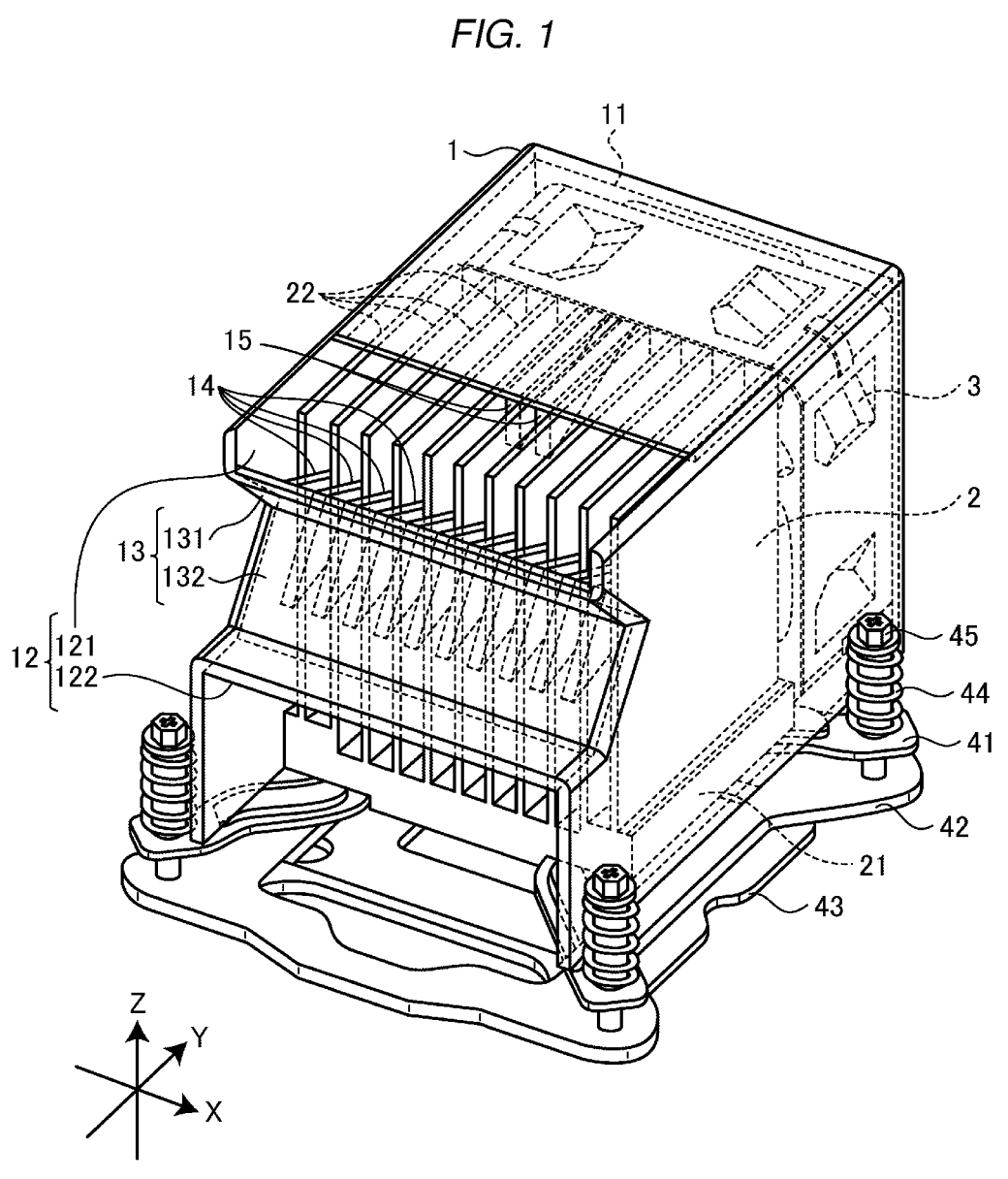
Figure 2:
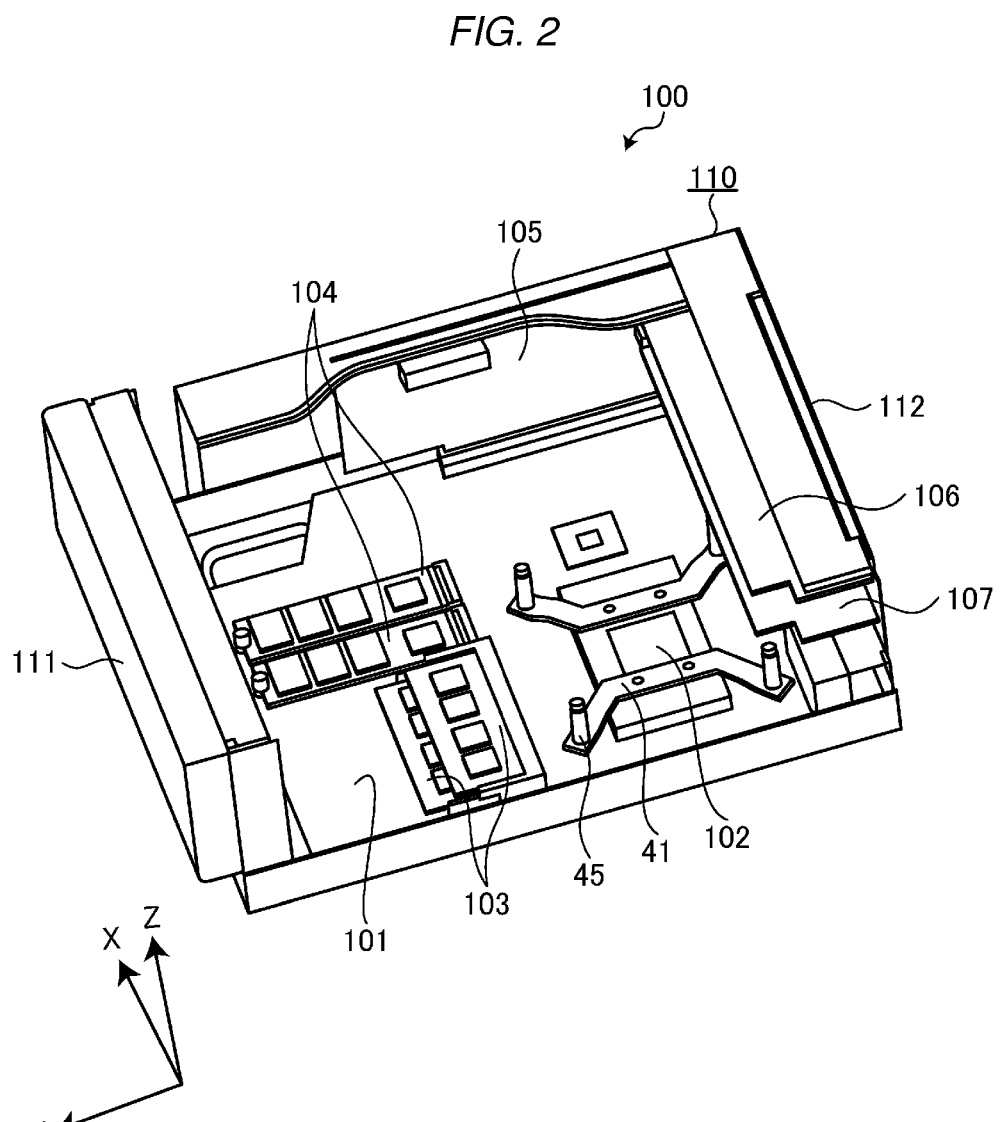
FIG. 2 is a perspective view schematically illustrating an example of a structure of an electronic device to which a duct is attached.

An embodiment will be described with reference to the drawings. FIG. 1 is a perspective view illustrating an example of an appearance of a cooling apparatus 200 according to a first embodiment. FIG. 2 is a perspective view schematically illustrating an example of a structure of an electronic device 100 to which the cooling apparatus 200 is attached. Here, for convenience of description, a three-dimensional coordinate system is also shown in the drawings. In the three-dimensional coordinate system, a width direction (left-right direction) of the cooling apparatus 200 and the electronic device 100 is an X-axis direction, a depth direction (front-rear direction) is a Y-axis direction, and a height direction (up-down direction) is a Z-axis direction. A positive direction of a Y-axis is a direction from a rear side to a front side of the electronic device 100, and the positive direction of the Y-axis is referred to as "front". A positive direction of a Z-axis is a direction from bottom to top.

First, as shown in FIG. 1, the cooling apparatus 200 includes a duct 1, a heat sink 2, and a fan 3. The duct 1 has a substantially box shape and covers the heat sink 2 and the fan 3 for blowing air to the heat sink 2. The fan 3 blows air in a negative direction (rearward) of the Y-axis. In the duct 1, an intake port 11 is provided upstream 3, and an exhaust port 12 is provided downstream in an air blowing direction of the fan.

Hereinafter, the term "upstream" simply means an upstream side (windward side) based on the air blowing direction of the fan 3 (the negative direction of the Y-axis). Similarly, the term "downstream" simply means a downstream side (leeward side) based on the air blowing direction of the fan 3.

The heat sink 2 is attached to a heat-generating electronic component. The "heat-generating electronic component" is, for example, a central processing unit (CPU). Heat generated by the CPU is conducted to the heat sink 2, and the heat of the heat sink 2 is dissipated to surrounding gas (air). Accordingly, malfunction and the like due to overheating of the CPU is prevented.

The heat sink 2 includes a base portion 21 and a plurality of fins 22. The base portion 21 is subjected to conduction of heat generated by the electronic component. The plurality of fins 22 are erected on the base portion 21 side by side in a thickness direction. The plurality of fins 22 are adjacent to each other at a predetermined interval. The base portion 21 is in contact with the CPU, and the heat of the CPU is conducted. The fins 22 dissipate, into air, heat conducted from the base portion 21 connected to the fins 22.

The heat sink 2 is fixed onto frames 41 to 43, which are layered at predetermined intervals, by helical springs 44 and screws 45. A motherboard 101 (see FIG. 2) is sandwiched between the frame 41 and the frame 42.

The fan 3 is an axial flow fan, and is a propeller fan including one or more propellers around a rotation shaft. The fan 3 is a rotating propeller and continuously sends air. Air blowing caused by the rotation of the fan 3 generates an air flow between the fins 22. The air sent by the fan 3 carries heat dissipated by the fins 22 and the base portion 21 to the downstream side, and promotes heat dissipation. Accordingly, the fan 3 cools the heat sink 2.

In the present embodiment, the intake port 11, the fan 3, the heat sink 2, and the exhaust port 12 are disposed in this order from the upstream side to the downstream side in the air blowing direction of the fan 3. The gas (air) taken in from the intake port 11 by the fan 3 flows mainly around the fins 22 of the heat sink 2 to take heat of the fins 22, and is exhausted from the exhaust port 12.

The duct 1 allows the air blown by the fan 3 to efficiently act on the heat dissipation of the heat sink 2 to improve a heat dissipation effect. Specifically, the duct 1 surrounds a periphery of the heat sink 2 and partitions a range in which the air sent by the fan 3 for cooling the heat sink 2 flows. Gas in the duct 1 is replaced with the gas taken in from the intake port 11 by the rotation of the fan 3, and is pushed out from the exhaust port 12. Accordingly, the gas around the heat sink 2 is quickly replaced.

For the convenience of an operation of the cooling apparatus 200 as described above, it is desirable that no component (obstacle) that interferes with the exhaust is present on the leeward side of the exhaust port 12. However, an obstacle may be disposed downstream of the exhaust port 12 depending on a size of the electronic device 100 including the cooling apparatus 200, an arrangement of built-in components, and the like.

As shown in FIG. 2, the electronic device 100 includes the motherboard 101, a CPU 102, a memory 103, a solid state drive (SSD) 104, a riser card 105, expansion boards 106 and 107 such as I/O boards, and a housing 110.

The housing 110 houses the above-described units (the motherboard 101, the CPU 102, the memory 103, the SSD 104, the riser card 105, and the expansion boards 106 and 107 such as I/O boards).

The motherboard 101 is an example of a substrate on which electronic components (the CPU 102 in the present embodiment) that dissipate heat by the heat sink 2 are mounted. The memory 103 and the SSD 104 also generate heat according to operations. This heat is also dissipated by a flow of gas in the housing 110 generated by the air blown by the fan 3.

Although the expansion boards 106 and 107 can be directly connected to the motherboard 101, in this case, since the expansion boards 106 and 107 stand upright on the motherboard 101, a dimension of the housing 110 in the height direction is necessary increased, and a size of the electronic device 100 increases. In order to prevent the above problem, the riser card 105 is used.

The riser card 105 mediates connection between the expansion boards 106 and 107 and the motherboard 101. The riser card 105 has one or more slots for receiving insertion of the expansion boards 106 and 107, and is inserted into a slot of the motherboard 101. Due to the riser card 105, the expansion boards 106 and 107 are positioned substantially parallel to and connected to the motherboard 101 without standing upright on the motherboard 101. Accordingly, a height dimension of the housing 110 can be reduced.

With the above-described arrangement, the expansion boards 106 and 107 are positioned downstream of the exhaust port 12 in the air blowing direction of the fan 3. In this case, if an exhaust direction from the exhaust port 12 is temporarily backward (the negative direction of the Y-axis), the expansion boards 106 and 107 become obstacles that interfere with the exhaust. In the present embodiment, the exhaust direction is configured to avoid the expansion boards 106 and 107.

Figure 3:
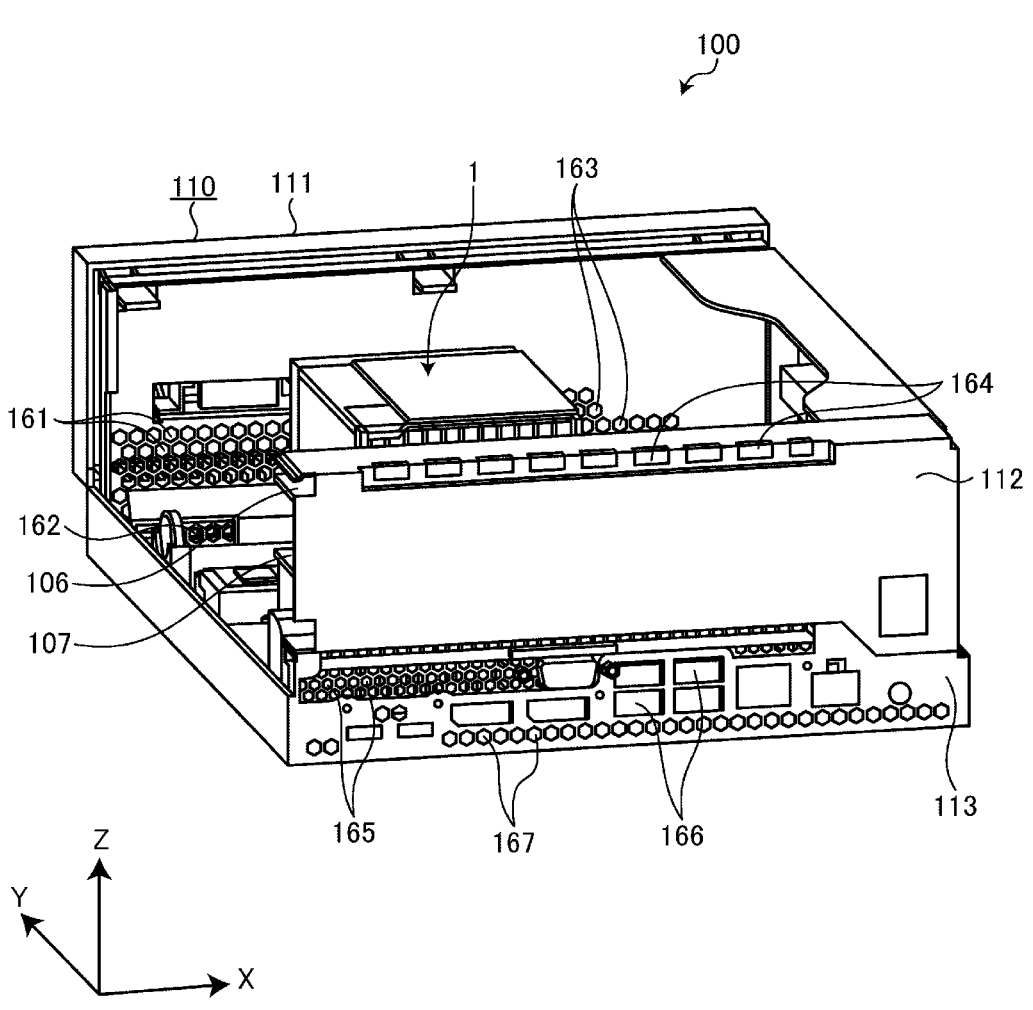
FIG. 3 is a perspective view illustrating an example of vent holes.

FIG. 3 is a perspective view illustrating an example of vent holes 161 to 167 provided in the electronic device 100. The perspective view is a view of the electronic device 100 as viewed from the rear side.

The electronic device 100 includes the duct 1, the heat sink 2 and the fan 3 covered with the duct 1, the motherboard 101, and the housing 110. The housing 110 houses the motherboard 101 and the duct 1, and the housing 110 has vent holes 161 to 167 for sucking and exhausting air.

The housing 110 includes a front cover 111, a rear cover 112, and an I/O panel 113. The front cover 111 is a part constituting a front surface of the housing 110. The front cover 111 has the vent holes 161 to 163. The rear cover 112 is a part constituting a rear surface of the housing 110. The rear cover 112 has the vent holes 164 and 165. The vent hole 164 is positioned in an upper portion of the rear surface of housing 110. The vent hole 165 is positioned in a lower portion of the rear surface of housing 110.

The I/O panel 113 constitutes a part of the rear surface of the housing 110. The I/O panel 113 has the vent holes 166 and 167. The vent holes 166 and 167 are positioned in the lower portion of the rear surface of the housing 110. The vent hole 166 is an opening portion for receiving insertion of a connector into the I/O boards (the expansion boards 106 and 107).

Each of the vent holes 161 to 167 sucks or exhausts gas (air). Among them, the vent holes 164 to 166 provided on the rear side of the housing 110 are mainly responsible for exhaust.

In the electronic device 100 according to the present embodiment, the expansion boards 106 and 107 are disposed behind the CPU 102. Therefore, the exhaust port 12 of the duct 1 is divided by a branch wall 13 and branch ribs 14 into an exhaust port 121 that opens toward the rear upper side and an exhaust port 122 that opens toward the rear lower side such that the exhaust avoids the expansion boards 106 and 107 (see FIG. 1).

Figure 4:
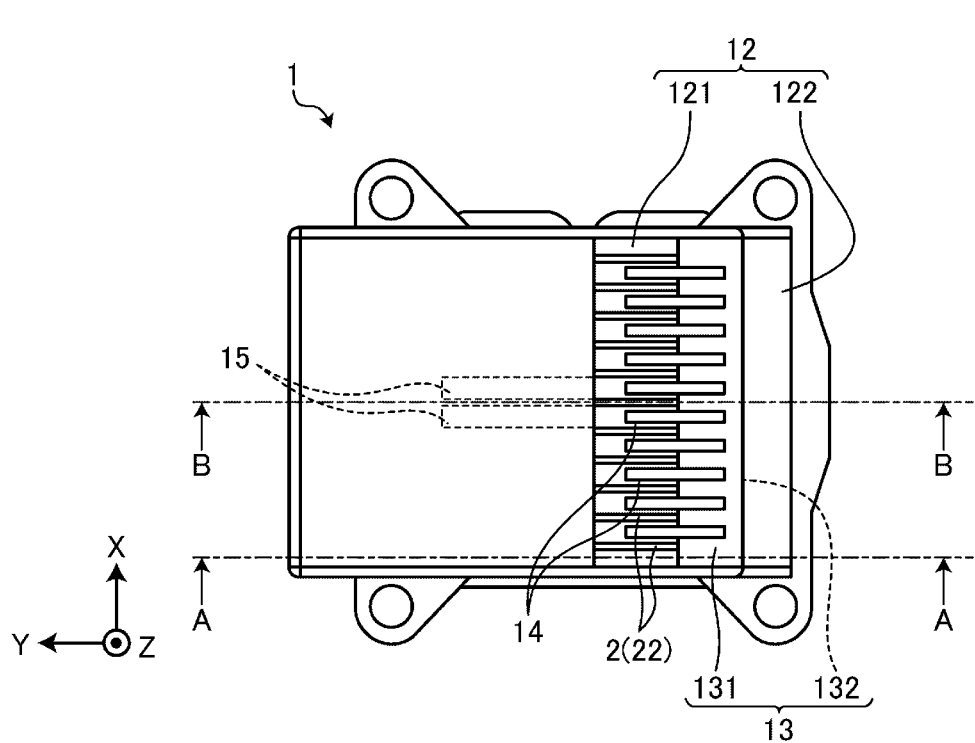
FIG. 4 is a plan view illustrating a shape of the duct.
Figure 5:
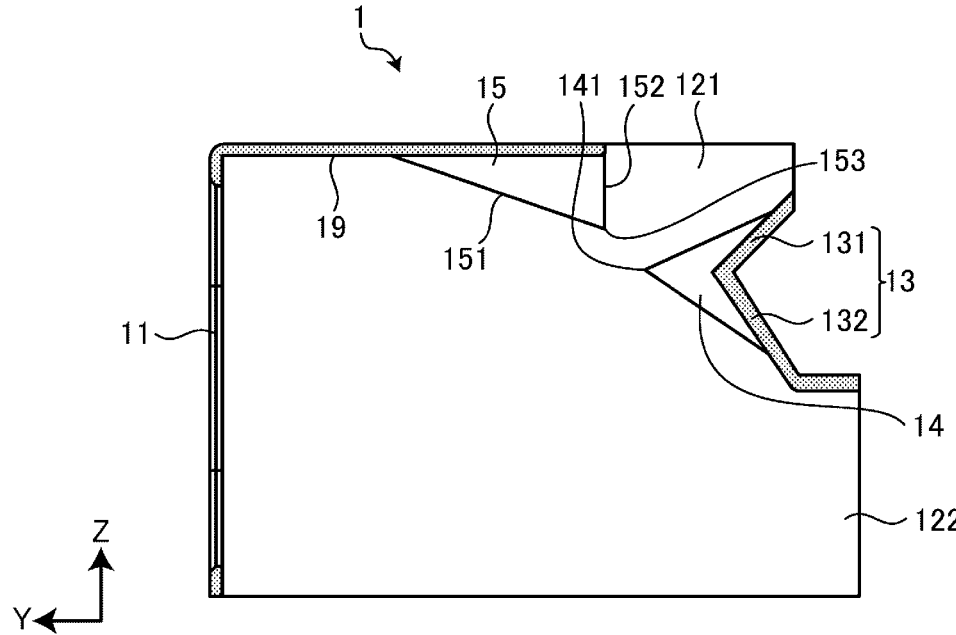
FIG. 5 is a longitudinal sectional side view illustrating the shape of the duct.

Here, shapes of the branch wall 13 and the branch ribs 14 will be described in more detail with reference to FIGS. 4 and 5. FIG. 4 is a plan view illustrating the shape of the duct 1. FIG. 5 is a longitudinal sectional side view illustrating the shape of the duct 1. A cross-sectional position of FIG. 5 is a position of a line A-A illustrated in FIG. 4.

The branch wall 13 is disposed on an inner side of an edge of the exhaust port 12, and divides the exhaust port 12 into the exhaust port 121 and the exhaust port 122. The branch wall 13 has a substantially V-shaped cross section in a side view, and a bent portion of the branch wall 13 protrudes toward the heat sink 2. Accordingly, a flow direction of the gas passing through the heat sink 2 is divided into two.

More specifically, the branch wall 13 includes two plate-shaped portions 131 and 132. The plate-shaped portions 131 and 132 are continuous with each other at the upstream side thereof. In addition, the plate-shaped portions 131 and 132 are inclined with respect to the air blowing direction of the fan 3 such that a distance between the plate-shaped portions 131 and 132 increases toward the downstream side. The first plate-shaped portion 131 guides the flow direction of the gas obliquely upward. The second plate-shaped portion 132 guides the flow direction of the gas obliquely downward. Accordingly, the branch wall 13 guides exhaust gas such that the exhaust gas avoids a partial range downstream of the branch wall 13, and branches the exhaust gas.

An angle formed by each of the two plate-shaped portions 131 and 132 of the branch wall 13 and the air blowing direction of the fan 3 (the negative direction of the Y-axis) is 45° or more, and an angle formed by the two plate-shaped portions 131 and 132 is a right angle (90°) or an obtuse angle slightly larger than the right angle. An angle setting and the like of the branch wall 13 are determined in consideration of a life and ease of manufacturing of a mold.

The branch ribs 14 are erected on a surface of the branch wall 13 on the heat sink 2 side. A plurality of the branch ribs 14 is provided side by side in the left-right direction at a regular interval. More specifically, the plurality of branch ribs 14 are provided side by side in a thickness direction thereof at intervals to be inserted between the fins 22. At least tip end portions of the branch ribs 14 are inserted between the fins 22.

The branch ribs 14 protrude from a surface of the branch wall 13 facing the heat sink 2 by a distance larger than an interval between the branch wall 13 and the heat sink 2. Each of the branch ribs 14 has a thickness equal to or smaller than the interval between the fins 22 of the heat sink 2, and has a substantially mountain shaped plate shape. A shape of an edge of the mountain shape of each of the branch ribs 14 may be linear or curved.

The edge of the mountain shape of the branch rib 14 is inclined with respect to the air blowing direction. An angle formed by the air blowing direction of the fan 3 (the negative direction of the Y-axis) and the edge of the mountain shape of the branch rib 14 is effectively in a range of 20° to 45°, and more preferably about 30°. An angle of the mountain shape at a top portion 141, which is the most protruding portion, is an acute angle.

An angle setting and the like of the branch rib 14 described above are determined based on a result of simulation of a cooling effect such that a desired effect can be obtained and a mold can be designed.

For example, if the angle formed by the air blowing direction of the fan 3 and the edge of the mountain shape of the branch rib 14 is too large, a desired effect cannot be obtained. In order to obtain a desired effect, it is desirable to set the angle to at least 45° or less.

If the angle formed by the air blowing direction of the fan 3 and the edge of the mountain shape of the branch rib 14 is too small (for example, less than 20°), the top portion 141 of the branch rib 14 becomes too sharp, and a filling failure is likely to occur during mold forming. Therefore, a too small angle is not preferred. Further, in this case, if the branch rib 14 is made long (a dimension from the top portion 141 to a root is large) in order to sufficiently secure a dimension of the root in the height direction, the branch rib 14 does not fall within the exhaust port 121 in a plan view (viewpoint in a negative direction of the Z-axis), and a structure of the mold becomes complicated.

In order to obtain a desired effect by avoiding the above-described inconvenience and to form by a mold having a simple structure in which a filling failure is unlikely to occur, the angle formed by the air blowing direction of the fan 3 and the edge of the mountain shape of the branch rib 14 is desirably 20° or more and 45° or less, and is preferably about 30°.

If a thickness of the root of the branch rib 14 is 3 mm or less, sink marks are less likely to occur, and there is no need to perform thinning on a mold. Since there is no wall above and below the branch rib 14, the branch rib 14 can be molded with a normal cavity and core. Accordingly, a tip end of the branch rib 14 can be formed into a sharp shape.

Figure 6:
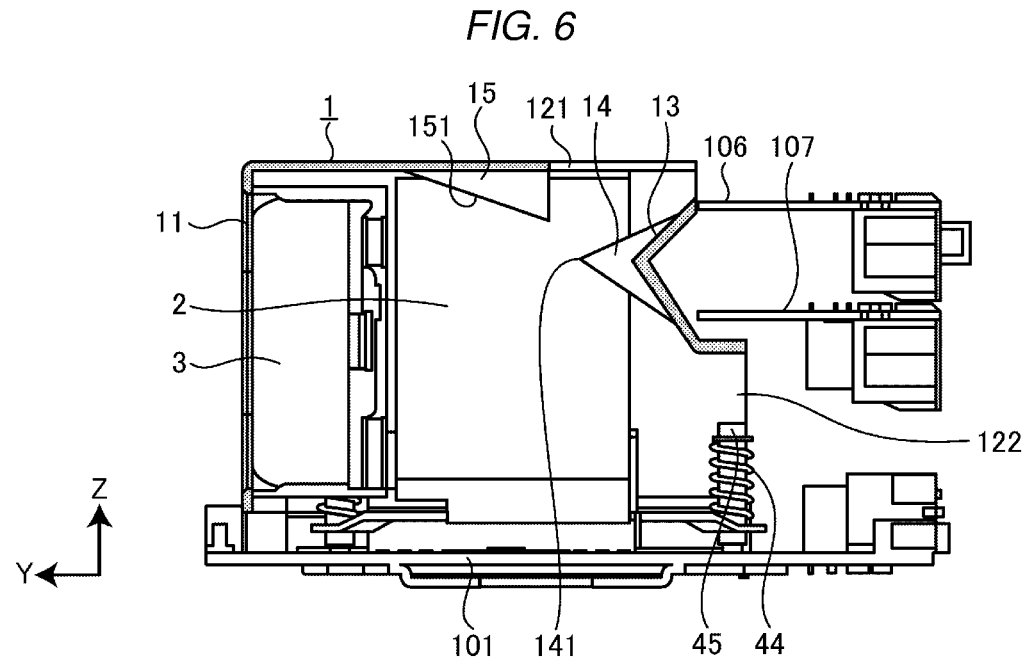
FIG. 6 is a longitudinal sectional side view illustrating a positional relationship between the duct and components near an exhaust port.

FIG. 6 is a longitudinal sectional side view illustrating a positional relationship between the duct 1 and components (the expansion boards 106 and 107) near the exhaust port 12 (121 and 122). A cross-sectional position of FIG. 6 is a position of a line B-B illustrated in FIG. 4. As illustrated here, the exhaust direction of the exhaust ports 121 and 122 is set to avoid the near components (the expansion boards 106 and 107) and such that the exhaust gas passes around the components.

Referring back to FIG. 5, the duct 1 includes drift ribs 15 on a top surface 19. The top surface 19 is a surface facing tip ends of the fins 22 in an inner surface of the duct 1. The drift ribs 15 each have a thickness equal to or less than the interval of the fins 22 of the heat sink 2 and are inserted between the adjacent fins 22.

The drift rib 15 has a substantially mountain shape in a side view. More specifically, the shape of the drift rib 15 is a mountain shape with a top portion 153 being sandwiched between an inclined surface 151 inclined with respect to the top surface 19 and an end surface 152 substantially standing upright on the top surface 19. The inclined surface 151 receives the air sent by the fan 3. The inclined surface 151 forms an edge having a mountain shape in a side view, and is inclined with respect to the air blowing direction of the fan 3.

The drift rib 15 is provided at a position downstream of a central portion of the fan 3 in the width direction (X-axis direction). In the configuration of the present embodiment, the position is also a central portion of the duct 1 in the width direction, and is also a central portion of the heat sink 2 in an arrangement direction of the fins 22. A position of the drift ribs 15 in the Y-axis direction is between the fan 3 and the branch wall 13.

The drift rib 15 protrudes from the top surface 19 of the duct 1 from a tip end side toward a root side of the fin 22 positioned in a region downstream of the rotation shaft of the fan 3. A protruding dimension of the drift rib 15 from the top surface 19 is larger toward the downstream side in the air blowing direction of the fan 3. That is, the inclined surface 151 is inclined with respect to an air blowing opening of the fan 3 and faces the air blowing opening of the fan 3. Air sent from an outer peripheral portion of the fan 3 flows along the inclined surface 151. Accordingly, a direction of wind at the position is guided by the inclined surface 151, and is directed toward the rotation shaft of the fan 3.

An angle of the inclined surface 151 is determined by simulation of a cooling effect such that a desired effect can be obtained and a mold can be designed.

A protruding height of the drift rib 15 is considered suitable such that the top portion 153 does not overlap the top portion 141 of the branch rib 14 when viewed from the fan 3 side (that is, when viewed from the negative direction of the Y-axis). This is because if the top portion 153 and the top portion 141 overlap when viewed from the negative direction of the Y-axis, the exhaust from the exhaust port 121 may be interfered.

In such a configuration, when the electronic device 100 is energized and operated, the CPU 102, the SSD 104, and the like generate heat, and the temperature rises. When the fan 3 is operated to blow air, the gas in the duct 1 and the housing 110 flows and ventilation is performed. Therefore, the heat of the CPU 102 and the like is removed, and overheating of the CPU 102 and the like is prevented.

The branch wall 13 and the branch ribs 14 divide the flow direction of the air, which is warmed via the heat sink 2 and exhausted from the exhaust port 12, into the exhaust port 121 and the exhaust port 122. According to the simulation, as compared to a case when the branch wall 13 and the branch ribs 14 are not provided and the ventilation is influenced by obstacles (the expansion boards 106 and 107), the ventilation is performed more efficiently if the branch wall 13 and the branch ribs 14 are provided, and heat rise of the CPU 102 and the like is prevented.

As described above, according to the duct 1, even if there is an obstacle on the leeward side of the duct 1, air can be exhausted while avoiding the obstacle, and therefore, heat generated inside the electronic device 100 can be appropriately dissipated.

Further, in the cooling apparatus 200 as described above, the drift ribs 15 provided in the duct 1 guide the wind sent from the outer peripheral portion of the fan 3 downward. As a characteristic of the axial flow fan, a wind speed on a downstream side of a center portion of the rotation is low, and the wind speed on an outer side is high. The drift ribs 15 guide the fast flow sent by the outer peripheral portion of the fan 3 toward the side on which a center of the rotation is present. Accordingly, the fast flow is added to the downstream side of the rotation shaft, and therefore, the wind speed at the position can be increased.

In general, a heat-generating electronic component (such as the CPU 102) is positioned in a central portion of a range below the heat sink 2. Therefore, the central portion of the heat sink 2 is considered to be highly heated. Nevertheless, it is considered that a flow speed at the position is low and heat dissipation is not performed more efficiently when a range directly above the heat-generating electronic component is corresponding to the downstream side of the rotation shaft. Therefore, as in the present embodiment, by performing an operation of increasing the wind speed around the center of the rotation, the wind can be efficiently used, and the heat dissipation performance can be improved.

While certain embodiments have been described, these embodiments have been presented by way of examples only, and are not intended to limit the scope of the disclosure. These novel embodiments can be executed in various other forms, and various omissions, substitutions, changes, and combinations can be made within a scope not departing from the spirit of the disclosure. The embodiments and the modification thereof are included in the scope and the spirit of the disclosure and are also included in the disclosure described in the scope of claims and an equivalent scope thereof.

What is claimed is:

1. A cooling apparatus for an electronic device, the cooling apparatus comprising:
a heat sink comprising a plurality of fins erected side by side in a thickness direction on a base portion configured to receive heat of an electronic component;
   a fan configured to generate an air flow between the plurality of fins by blowing air;
a drift rib positioned on a tip end side of the plurality of fins on a downstream side in an air blowing direction of a central portion of the fan in a width direction, the drift rib has an inclined surface guiding air flowing through the position toward a root side of the plurality of fins, and is configured to be inserted between adjacent fins; and
   a duct which covers the heat sink and the fan, and is provided with an intake port upstream and an exhaust port downstream in the air blowing direction, wherein the duct has a branch wall which divides an exhaust direction from the exhaust port into two, and
   the drift rib is positioned between the branch wall.

2. The cooling apparatus according to claim 1, wherein the branch wall is inclined with respect to the air blowing direction of the fan such that two plate-shaped portions continuous with each other on one side are separated from each other toward the downstream side in the air blowing direction, and
   the cooling apparatus further comprises:
a plurality of branch ribs which protrude from a surface of the branch wall facing the heat sink by a distance larger than an interval between the branch wall and the heat sink, have a mountain shaped plate shape with a most protruding top portion having an acute angle, have a thickness equal to or less than an interval between the fins of the heat sink, and are provided side by side in the thickness direction thereof at intervals configured to be inserted between the fins.

3. The cooling apparatus according to claim 2, wherein the inclined surface of the drift rib has a size and is positioned such that the inclined surface does not overlap with the top portion of the branch rib when viewed from the fan.

4. The cooling apparatus according to claim 2, wherein the plurality of branch ribs are adjacent to each other at a predetermined interval.

5. The cooling apparatus according to claim 1, wherein the inclined surface of the drift rib is a flat surface or a curved surface.

6. The cooling apparatus according to claim 1, wherein the duct has a substantially box shape.

7. The cooling apparatus according to claim 1, wherein the plurality of fins are adjacent to each other at a predetermined interval.

8. The cooling apparatus according to claim 1, wherein the electronic component comprises at least one of a central processing unit, a motherboard, a memory, a solid state drive, a riser card, and an I/O board.

9. The cooling apparatus according to claim 1, wherein the heat sink is fixed onto two frames layered at predetermined intervals, by helical springs and screws.

10. A personal computer, comprising:
central processing unit; and
a cooling device, comprising:
   a heat sink comprising a plurality of fins erected side by side in a thickness direction on a base portion configured to receive heat of an electronic component;
   a fan configured to generate an air flow between the plurality of fins by blowing air;
   a drift rib positioned on a tip end side of the plurality of fins on a downstream side in an air blowing direction of a central portion of the fan in a width direction, the drift rib has an inclined surface guiding air flowing through the position toward a root side of the plurality of fins, and is configured to be inserted between adjacent fins; and
a duct which covers the heat sink and the fan, and is provided with an intake port upstream and an exhaust port downstream in the air blowing direction, wherein
the duct has a branch wall which divides an exhaust direction from the exhaust port into two, and
the drift rib is positioned between the branch wall and the fan, and protrudes from an inner surface of the duct facing a tip end of the fin.

11. The personal computer according to claim 10, wherein the branch wall is inclined with respect to the air blowing direction of the fan such that two plate-shaped portions continuous with each other on one side are separated from each other toward the downstream side in the air blowing direction, and
the cooling device further comprises:
a plurality of branch ribs which protrude from a surface of the branch wall facing the heat sink by a distance larger than an interval between the branch wall and the heat sink, have a mountain shaped plate shape with a most protruding top portion having an acute angle, have a thickness equal to or less than an interval between the fins of the heat sink, and are provided side by side in the thickness direction thereof at intervals configured to be inserted between the fins.

12. The personal computer according to claim 11, wherein the inclined surface of the drift rib has a size and is positioned such that the inclined surface does not overlap with the top portion of the branch rib when viewed from the fan.

13. The personal computer according to claim 11, wherein the plurality of branch ribs are adjacent to each other at a predetermined interval.

14. The personal computer according to claim 10, wherein the inclined surface of the drift rib is a flat surface or a curved surface.

15. The personal computer according to claim 10, wherein the duct has a substantially box shape.

16. The personal computer according to claim 10, wherein the plurality of fins are adjacent to each other at a predetermined interval.

17. The personal computer according to claim 10, further comprises at least one of a motherboard, a memory, a solid state drive, a riser card, and an I/O board.

18. The personal computer according to claim 10, wherein the heat sink is fixed onto two frames layered at predetermined intervals, by helical springs and screws.

* * * * *